United States Patent
Wong et al.

(10) Patent No.: US 7,335,559 B2
(45) Date of Patent: Feb. 26, 2008

(54) FABRICATING METHOD OF NON-VOLATILE MEMORY

(75) Inventors: Wei-Zhe Wong, Tainan (TW);
Ching-Sung Yang, Hsinchu (TW);
Chih-Chen Cho, Taipei (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/778,655

(22) Filed: Jul. 17, 2007

(65) Prior Publication Data
US 2007/0259497 A1 Nov. 8, 2007

Related U.S. Application Data

(62) Division of application No. 11/162,116, filed on Aug. 29, 2005, now Pat. No. 7,274,062.

(30) Foreign Application Priority Data
Feb. 3, 2005 (TW) .............................. 94103338 A

(51) Int. Cl.
*H01L 21/336* (2006.01)
(52) U.S. Cl. ...................................... 438/257; 438/266
(58) Field of Classification Search ................ 438/257, 438/258, 259, 266
See application file for complete search history.

(56) References Cited

U.S. PATENT DOCUMENTS

2006/0171206 A1* 8/2006 Wong et al. ........... 365/185.28

* cited by examiner

*Primary Examiner*—Jack Chen
(74) *Attorney, Agent, or Firm*—Jianq Chyun IP Office

(57) ABSTRACT

A non-volatile memory is provided. A substrate has at least two isolation structures therein to define an active area. A well is located in the substrate. A shallow doped region is located in the well. At least two stacked gate structures are located on the substrate. Pocket doped regions are located in the substrate at the peripheries of the stacked gate structures; each of the pocket doped regions extends under the stacked gate structure. Drain regions are located in the pocket doped regions at the peripheries of the stacked gate structures. An auxiliary gate layer is located on the substrate between the stacked gate structures. A gate dielectric layer is located between the auxiliary gate layer and the substrate and between the auxiliary gate layer and the stacked gate structure. Plugs are located on the substrate and extended to connect with the pocket doped region and the drain regions therein.

9 Claims, 9 Drawing Sheets

FABRICATING METHOD OF NON-VOLATILE MEMORY

CROSS-REFERENCE TO RELATED APPLICATION

This application is a divisional of an application Ser. No. 11/162,116, filed on. Aug. 29, 2005, now U.S. Pat. No. 7,274,062, which claims the priority benefit of Taiwan application serial no. 94103338, filed on Feb. 3, 2005. The entirety of each of the above-identified patent applications is hereby incorporated herein by reference and made a part of this specification.

BACKGROUND OF THE INVENTION

1. Field of the Invention

The present invention generally relates to a structure, a fabricating method and an operating method for a memory cell. More particularly, the present invention relates to a fabricating method for a non-volatile memory cell.

2. Description of Related Art

Due to the advantages of multiple data writing, reading, erasing and the stored data are retained even after the power is disconnected, the non-volatile memory has been widely applied to personal computers and electronic equipments.

A conventional non-volatile memory includes a floating gate and a control gate, which are made from polysilicon. While performing the programming or the erasing process on the non-volatile memory, bias voltages are applied to the source region, the drain region and the control gate, respectively, to inject electrons into the floating gate, or to pull electrons out from the floating gate. Conventionally, the injection of charges for the non-volatile memory includes the channel hot-electron injection (CHEI) mode and the Fowler-Nordheim Tunneling mode. Further, the modes for the programming and the erasing processes vary according to the methods for charge injection and ejection.

FIG. 1 illustrates a schematic cross-sectional view showing the structure of a conventional non-volatile memory. This non-volatile memory includes an n-type substrate 100, a p-type deep well region 102, an n-type well region 104, gate stacked structures 106a and 106b, an n type source region 108a, an n-type drain region 108b, a p-type shallow doped region 109, a p-type pocket doped region 110 and a plug 112. Accordingly, the p-type deep well region 102 is located in the substrate 100, the n-type well region 104 is allocated in the p-type deep well region 102. The gate stacked structures 106a and 106b are formed with, sequentially from the substrate 100, the tunneling layer 114, the floating gate 116, the gate dielectric layer 118, the control gate 120 and the mask layer 122. Further, spacers 124 are disposed on the sidewalls of the gate stacked structures 106a and 106b. The n-type source region 108a is disposed in the n-type well region 104 and the p-type shallow doped regions 109 between two stacked gate structures 106a and 106b. The p-type shallow doped region 109 is disposed in the n-type well region 104 and contiguous to the surface of the substrate. The p-type pocket doped region 110 is disposed at the periphery of the two stacked gate structures 106a and 106b, and is extended to the undersides of the stacked gate structures 106a and 106b contiguous to a neighbouring p-type shallow doped region 109. Furthermore, the n-type drain region 108b is disposed in p-type pocket doping region 110 at the periphery of the stacked gate structures 106a and 106b. The conducting plug 112 is disposed on the substrate 100 and penetrates through the n-type drain region 108b and a portion of the p-type pocket doped region 110.

However, while voltages are applied to the source region, the drain region and the control gate layer to perform the programming process on a memory cell of the previously mentioned non-volatile memory, such as, a memory cell constituted with the stacked gate structure 106a or 106b, the non-selected memory cells are affected by the applied voltages for the programming process. This is due to the fact that the control gate and the source region of the selected memory cell are connected to the control gate and the source region of a neighbouring cell through a shared word line and a shared source line. Consequently, the reliability of the memory devices is compromised.

Besides, while performing the above mentioned programming process for a non-volatile memory, the current leakage easily occurs due to the presence of the source region, and the short distance between the source region and control gate.

SUMMARY OF THE INVENTION

Generally speaking, the present invention is directed to provide a non-volatile memory for obviating any influence between neighboring memory cells due to an application of voltage on a selected memory cell during a programming operation.

In accordance with one aspect of the present invention, a fabricating method of a non-volatile memory is provided to prevent any influence between neighboring memory cells due to an application of voltage on a selected memory cell during a programming operation.

In accordance with another aspect of the present invention, an operating method of a non-volatile memory is provided to prevent any influence between the memory cells due an application of voltage on a selected memory cell during a programming operation.

Accordingly, the present invention is directed to provide a non-volatile memory, which includes a substrate, a plurality of trench isolations, a first conducting type well region, a second conducting type shallow doped region, a pair of stacked gate structures, two second conducting type pocket doped region, two first conducting type drain region, an auxiliary gate layer, a gate dielectric layer and at least two conducting plugs. The trench isolating structure is disposed in the substrate to define the active area. The first conducting type well region is disposed in the substrate and the second conducting type shallow doped region is disposed in the first conducting type well region and is contiguous to the surface of the substrate. The paired stacked gate structures are disposed in the active region above the substrate and beside the side of each trench isolation structure. Furthermore, the stacked gate structure includes at least a floating gate layer and a control gate layer disposed above the floating gate layer. Second conducting type pocket doped regions are disposed in the substrate at the peripheries of the paired stacked gate structures and are extended to the underside of the stacked gate structures, respectively. The first conducting type drain regions are disposed in the pocket doped region at the peripheries of the paired stacked structures. The auxiliary gate layer is disposed between the stacked gate structures and on the substrate, and the bottom of the auxiliary gate layer is lower than the bottom of the second conducting type shallow doped region. The gate dielectric layer is disposed at least between the auxiliary gate layer and the substrate, and between the auxiliary gate layer and each stacked gate structure. There are at least two conducting plugs disposed in the substrate, and the conducting plugs extend downward to connect with the pocket doped region and the drain region, which is in the pocket doped region.

According to an embodiment of the present invention for the above mentioned non-volatile memory, the substrate is, for example, a first conducting type substrate.

According to an embodiment of the present invention for the above mentioned non-volatile memory, the second conducting type deep well region is further disposed in the substrate, and the first conducting well region is disposed in the second conducting type deep well region.

According to an embodiment of the present invention for the above mentioned non-volatile memory, the stacked gate structure is sequentially stacked by a tunneling layer, the floating gate layer, the gate dielectric layer and the control gate layer on the substrate.

According to an embodiment of the present invention for the above mentioned non-volatile memory, the materials for the above mentioned auxiliary gate layer, the floating gate layer or the control gate layer can be, for example, polysilicon or doped silicon.

According to an embodiment of the present invention for the above mentioned non-volatile memory, the materials for the above mentioned gate dielectric layer can be, for example, silicon oxide.

According to an embodiment of the present invention for the above mentioned non-volatile memory, the memory array can be a NOR memory array.

According to an embodiment of the present invention for the above mentioned non-volatile memory, the first conducting type can be an n-type and the second conducting type can be a p-type.

According to an embodiment of the present invention for the above-mentioned non-volatile memory, the auxiliary gate layer is disposed on trench isolation structure.

In accordance with yet another aspect of the present invention, the non-volatile memory can employ the auxiliary gate layer to control the induction of the source region. By applying the appropriate auxiliary gate voltage to control the induction of the source region, the current leakage of the devices which often occurs in the conventional programming process, can be prevented. In addition, the selected memory cells will not affect the neighbouring memory cells and the reliability of the devices is improved.

A fabricating method for the non-volatile memory of the present invention is provided and the method includes providing a substrate, forming a plurality of trench isolation structures to define the active region, followed by forming a first conducting type well region in the substrate, and forming a second conducting type shallow doped region in the first conducting type well region and contiguous to the surface of the substrate. Thereafter, in the active region, at least a pair of stacked structures is formed on the substrate, and each stacked gate structure is disposed beside one side of each trench isolation structure. The stacked gate structure includes at least a floating gate layer and a control gate layer on the floating gate. Afterwards, in the substrate, two second conducting type of the pocket doped regions are formed at the peripheries of the stacked gate structures, and each pocket doped region is farther extended to the underside of each stacked gate structure. Thereafter, in the pocket doped region, a first conducting type drain region is formed at the peripheries of the stacked gate structures. Then, a portion of each trench isolation structure between the paired stacked gate structures is removed for the surface of the trench isolation structure be lower than the bottom of the second conducting type shallow doped region and form at least two trenches in the substrate. Furthermore, a gate dielectric layer is formed on the surface of the stacked gate structures and the exposed surface of the substrate. Between the two stacked gate structures, an auxiliary gate layer is formed on the gate dielectric layer. In order to cover the gate dielectric layer and the auxiliary gate layer, a dielectric layer is formed on the substrate, and there are at least two contact windows formed in the dielectric layer, which expose the drain region and a portion of the pocket doped region. Finally, a plurality of conducting plugs is formed in the contact windows.

According to an embodiment of the present invention for the above mentioned non-volatile memory, the method to remove a portion of the above mentioned trench isolation structure can be, for example, a self-aligned etching process.

According to an embodiment of the present invention for the above-mentioned fabricating method of the non-volatile memory, the substrate can be, for example, a first conducting type of substrate.

According to an embodiment of the present invention for the above mentioned fabricating method of the non-volatile memory, after the formation of the trench isolation structure and before the formation of the first conducting type well region, the second conducting type deep well region is formed in the substrate and the first conducting type well region is disposed in the second conducting type deep well region.

According to an embodiment of the present invention for the above mentioned fabricating method of the non-volatile memory, the stacked gate structure is sequentially stacked with a tunneling layer, a floating gate layer, the gate dielectric layer and a control gate layer on the substrate.

According to an embodiment of the present invention for the above mentioned fabricating method of the non-volatile memory, the materials for the above mentioned auxiliary gate layer, the floating gate layer or the control gate layer can be, for example, polysilicon or doped silicon.

According to an embodiment of the present invention for the above mentioned fabricating method of the non-volatile memory, the formation of the conducting plugs can be, for example, through a short circuit to connect the drain region and the pocket doped region.

According to an embodiment of the present invention for the above mentioned fabricating method of the non-volatile memory, the first conducting type can be an n-type and the second conducting type can be a p-type.

According to an embodiment of the present invention for the above-mentioned fabricating method of the non-volatile memory, the auxiliary gate layer fills the above-mentioned two trenches.

In accordance with again another aspect of the present invention, the fabricating method of the non-volatile memory can employ the auxiliary gate layer to control the induction of the source region. By applying the appropriate auxiliary gate voltage to control the induction of the source region, the current leakage of the devices which often occurs in the conventional device can be prevented. In addition, the fabricating method of the present invention is compatible with the conventional method; therefore, there is no extra spending for equipments.

An operating method for a non-volatile memory of the present invention is provided; in particular, this operating method can be applied to the above mentioned non-volatile memory and the procedures includes selecting between the two stacked gate structures as a designated memory cell, applying a first voltage to the control gate layer of the selected memory cell during a programming process. The operating method further includes applying a second voltage to the drain region disposed beside the side of the selected memory cell and the first conducting type well region; and applying a third voltage to the auxiliary gate layer and the second conducting type deep well region to perform the programming on the selected memory cell. The first voltage can be ranged between −5 and −15 volts, for example; the second voltage can be ranged between 1 and 10 volts, for example; and the third voltage can be, for example, 0 volt.

According to an embodiment of the present invention for the above mentioned fabricating method of the non-volatile memory, in order to perform an erasing process for the selected memory cell, the operating method further includes applying a fourth voltage on the control gate layer of the selected memory cell; applying a fifth voltage on the first conducting well region and the second conducting deep well region; and setting the drain region disposed at the side of the memory cell and the auxiliary gate layer at floating. The fourth voltage can be ranged between 5 and 15 volts, for example; and the fifth voltage can be ranged between −5 and −15 volts, for example.

According to an embodiment of the present invention for the above mentioned fabricating method of the non-volatile memory, in order to perform a reading process on the selected memory cell, the operating method further includes applying a sixth voltage to the control gate layer of the selected memory cell and the auxiliary gate layer; placing a seventh voltage on the first conducting well region; and applying an eighth voltage to the drain region disposed at the side of the selected memory cell and the second conducting type deep well region. In addition, the sixth voltage can be, for example, ranged between 1 and 10 volts; the seventh voltage can be ranged between 1 and 10 volts, for example; and the eighth voltage can be, for example, 0 volt.

In accordance with a further aspect of the present invention, the operating method of the non-volatile memory can employ the auxiliary gate layer to control the induction of the source region. By applying the appropriate auxiliary gate voltage to control the induction of the source region, the current leakage of the devices, which often occurs in the conventional programming operation, can be prevented. In addition, the selected memory cells will not affect other neighbouring memory cells and the reliability of the devices is improved.

It is to be understood that the foregoing general description and the following detailed description with attached figures are exemplary and explanatory for the objects, specification and merits of the present invention only, and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
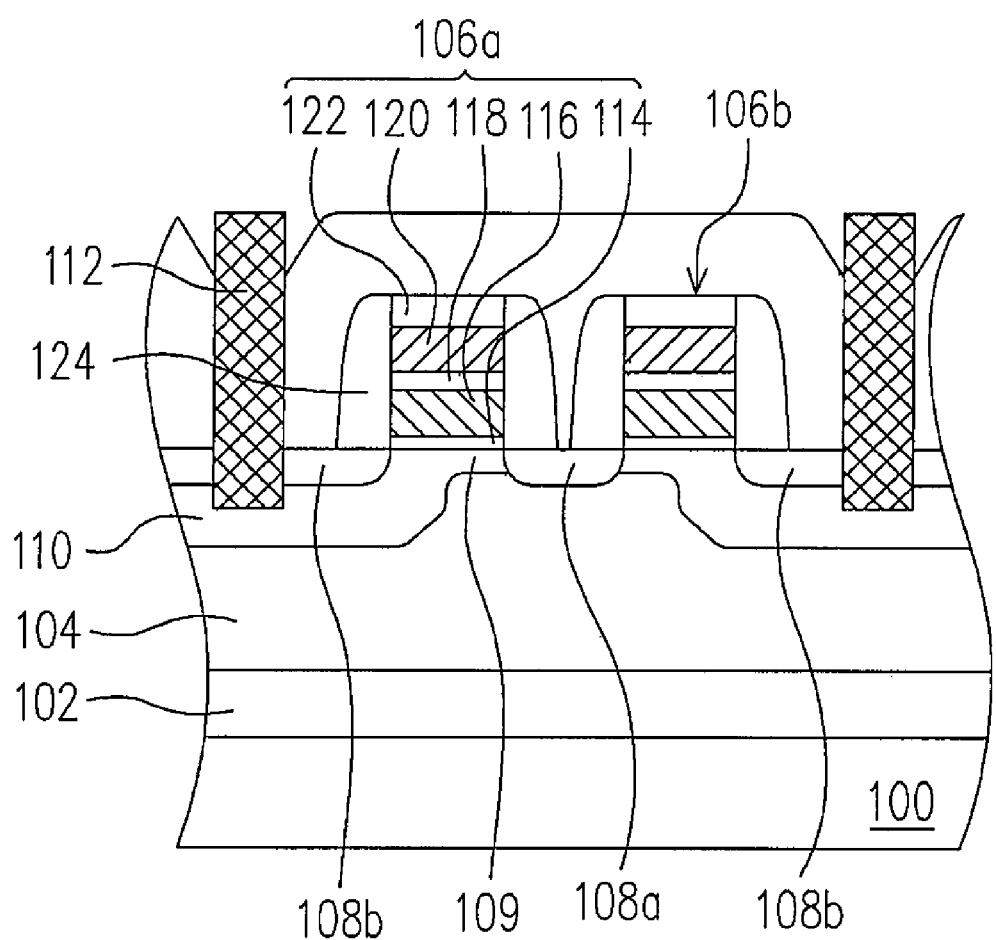
FIG. 1 is a schematic cross-sectional view of a conventional non-volatile memory.

Reference will now be made in detail to the present preferred embodiments of the invention, examples of which are illustrated in the accompanying drawings. Wherever possible, the same reference numbers are used in the drawings and the description to refer to the same or like parts.

In the following embodiment, the first conducting type is an n dopant type and the second conducting is a p dopant type. However, as is obvious to one ordinarily skilled in the art, the above mentioned conducting type can be switched, and, the alternative embodiment will not be described in detail herein. In addition, the presented embodiment applies a shared auxiliary gate layer of a NOR type non-volatile memory to illustrate the invention.

Figure 2:
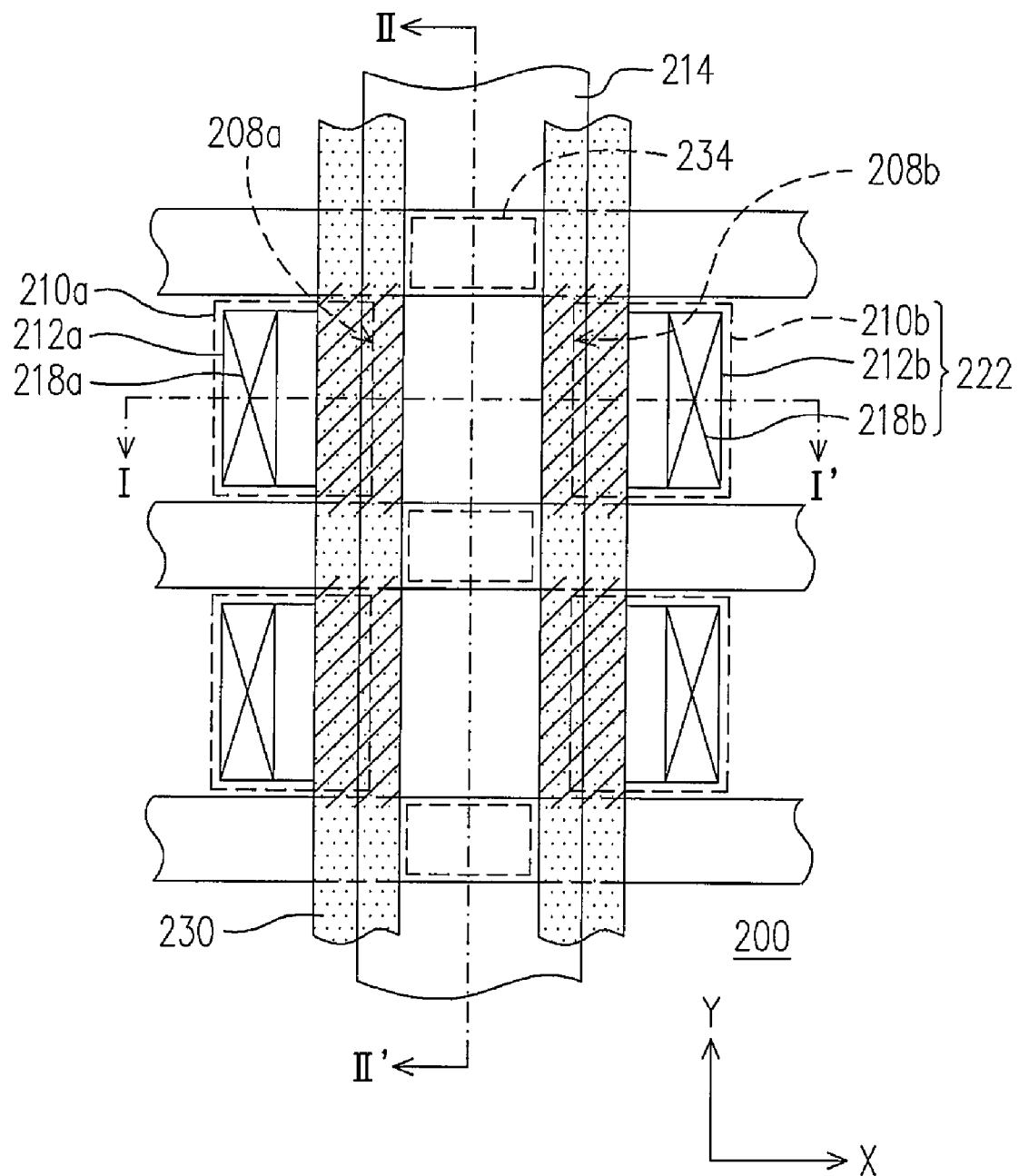
FIG. 2 is a schematic top view of a non-volatile memory according to an embodiment of the present invention.
Figure 3A:
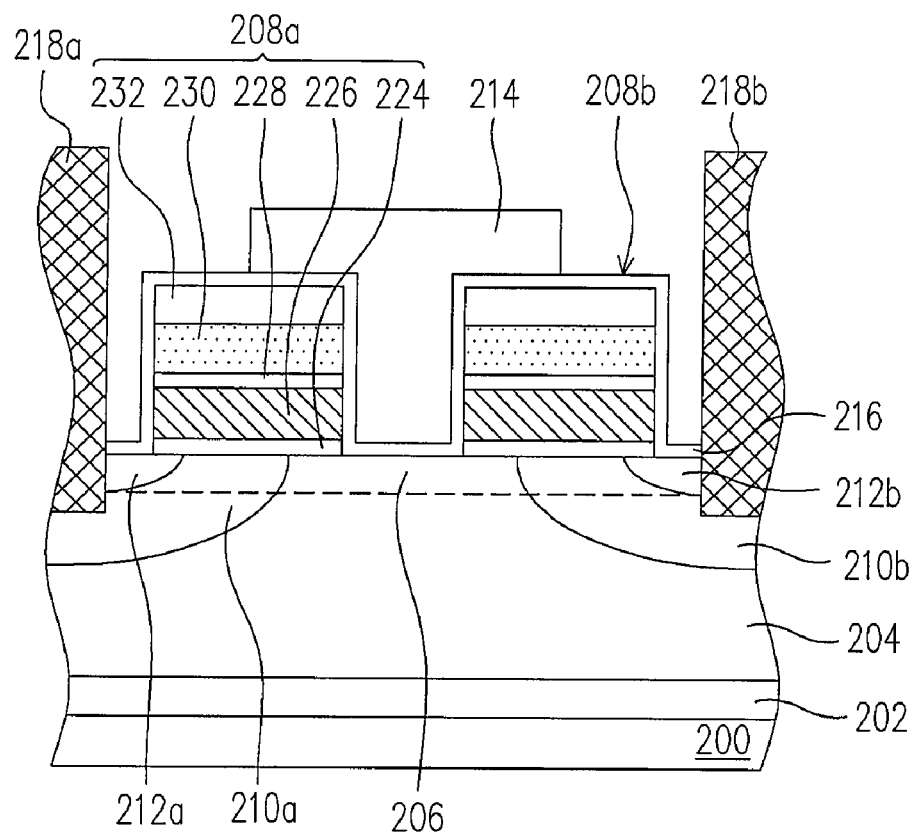
FIG. 3A is a schematic cross-sectional (X direction) diagram of a non-volatile memory along the cutting line I-I' in FIG. 2 according to an embodiment of the present invention.
Figure 3B:
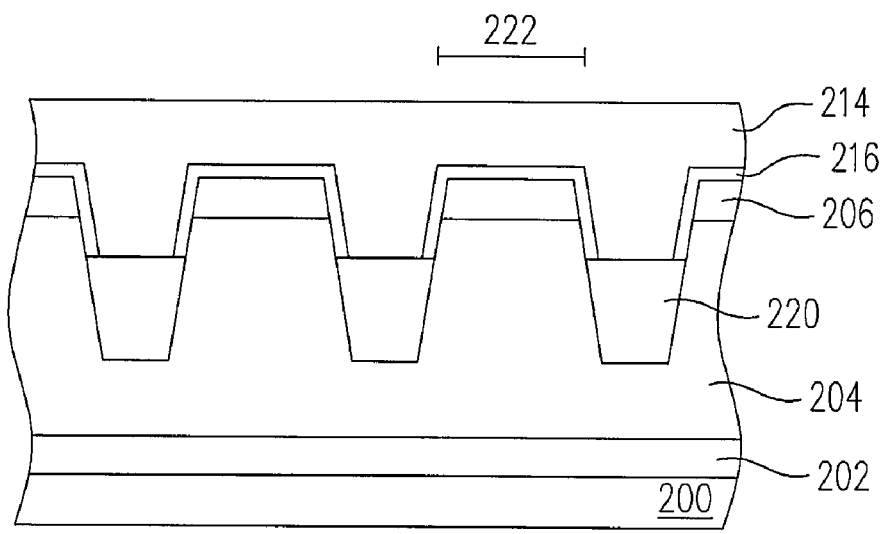
FIG. 3B is a schematic cross-sectional (Y direction) diagram of a non-volatile memory along the cutting line II-II' in FIG. 2 according to an embodiment of the present invention.

FIG. 2 is a schematic top view of a non-volatile memory according to an embodiment of the present invention. FIG. 3A is a schematic cross-sectional (X direction) diagram of a non-volatile memory along the cutting line I-I' in FIG. 2 according to an embodiment of the present invention. FIG. 3B is a schematic cross-sectional (Y direction) diagram of a non-volatile memory along the cutting line II-II' in FIG. 2 according to an embodiment of the present invention.

Please referring to FIG. 2, FIG. 3A and FIG. 3B concurrently, the non-volatile memory of the present invention includes at least an n-type substrate 200, a p-type deep well region 202, an n type well region 204, a p-type shallow pocket doped region 206, at least two stacked gate structures 208a and 208b, two p-type pocket doped regions 210a and 210b, two n-type drain regions 212a and 212b, an auxiliary gate layer 214, a gate dielectric layer 216, at least two conducting plugs 218a and 218b, and a trench isolation structure 220.

The trench isolation structure 220 is disposed in the substrate 200 to define the active region 222. In addition, the p-type deep well region 202 is disposed in the substrate 200. Further, the n type well region 204 is disposed in the p-type deep well region 202, while the p-type shallow doped region 206 is disposed in the n-type region 204 and is contiguous to the surface of the substrate 200.

Moreover, a paired of stacked gate structures 208a and 208b is disposed on the substrate 200 in the active region 222 beside the side of each trench isolation structure 220. Each stacked gate structure 208a and 208b is stacked sequentially with a tunnel layer 224, a floating gate layer 226, a gate dielectric layer 228 and a control gate layer 230 on the substrate 200. In one embodiment, the stacked gate structures 208a and 208b are further including a mask layer 232 disposed on the control gate layer 230. In addition, the material for the floating gate 226 is selected from the group consisting of polysilicon, doped silicon and other appropriate materials. In the same manner, the material for the control gate 230 is selected from the group consisting of polysilicon, doped silicon and other appropriate material.

Additionally, the p-type pocket doped regions 210a and 210b are respectively disposed at the periphery of the paired of stacked gate structures in the substrate 200, and the pocket doped regions 210a and 210b are further extended respectively to the underside of each stacked gate structure 208a and 208b. The n-type drain regions 212a and 212b are respectively disposed in the p-type pocket doped regions 210a and 210b at the peripheries of the stacked gate structures 208a and 208b.

Further, the auxiliary gate layer 214 is disposed on the substrate 200 between the two stacked gate structures 208a and 208b and in a portion of the trench isolation structure 220, wherein the bottom of the auxiliary gate layer 214 is lower than the bottom of the p-type shallow doped region 206. The material for the auxiliary gate layer 214 includes polysilicon, the doped polysilicon and other appropriate materials.

In addition, the gate dielectric layer 216 is at least disposed between the auxiliary gate layer 214 and the substrate 200, and between the auxiliary gate layer 214 and the stacked gate structures 208a and 208b. The material for the gate dielectric layer 216 can be, for example, silicon oxide. The conducting plugs 218a and 218b are disposed on the substrate 200; and conducting plug 218a is further extended to connect the drain region 212a and the pocket doping region 210a, while the conducting plug 218b is extended to connect the drain region 212b and the pocket doping region 210b.

According to the operating method of the non-volatile memory in the present invention, during the programming process, the auxiliary gate layer is used to control the induction of the source region. By applying the appropriate auxiliary gate voltage to control the induction of the source region, the current leakage of the devices, which often occurs in the conventional programming operation, can be prevented. In addition, the selected memory cells will not affect other neighbouring memory cells during programming process. Accordingly, the reliability of the devices is improved.

It is noteworthy to be mentioned that, according to the above embodiment of the present invention, only two stacked gate structures 208a and 208b of the non-volatile memory are illustrated. However, the embodiment is not intended to be limited by these embodiments. On the contrary, the invention is intended to cover alternatives, modifications and equivalents, which may be included within the spirit and scope of the invention as defined by the appended claims. And, it is understandable that the one skilled in the art can apply four stacked gate structures 208a, 208b, 208c, and 208d for the invention. More stacked gate structures imply that more memory cells can be applied. Therefore, if every two stacked gate structures are paired, for example, 208a and 208b as a pair, and 208c and 208d as another pair, each pair will share a pocket doped region, a drain region and a conducting plug.

The steps of the fabricating method of the above-mentioned non-volatile memory are illustrated by FIG. 5A~5D and FIG. 6A~6D. FIG. 5A to FIG. 5D are schematic cross-sectional (X direction) diagrams of a non-volatile memory along the cutting line I-I' in FIG. 2, while FIG. 6A to FIG. 6D are schematic cross-sectional (Y direction) diagrams of FIG. 2 along the cutting line II-II'.

Figure 5A:
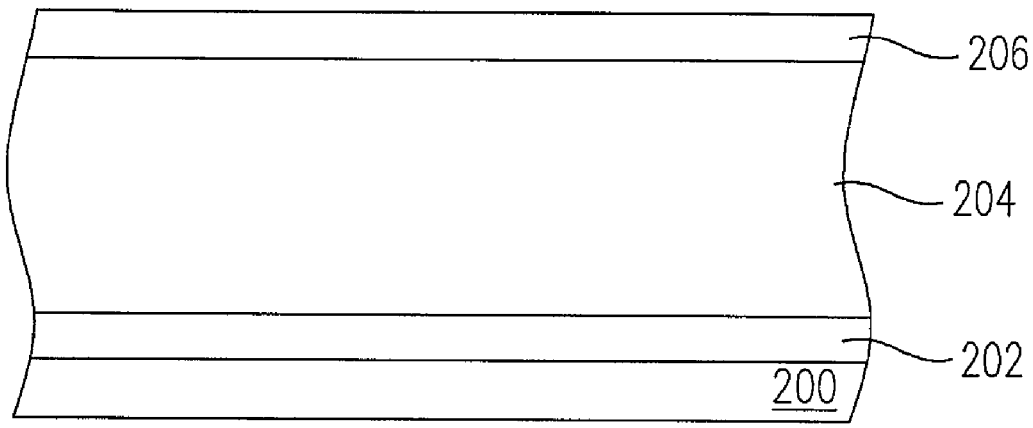
FIG. 5A to FIG. 5D are schematic cross-sectional (X direction) diagrams of FIG. 2 along the cutting line I-I' showing the steps for the fabricating method of the non-volatile memory.
Figure 6A:
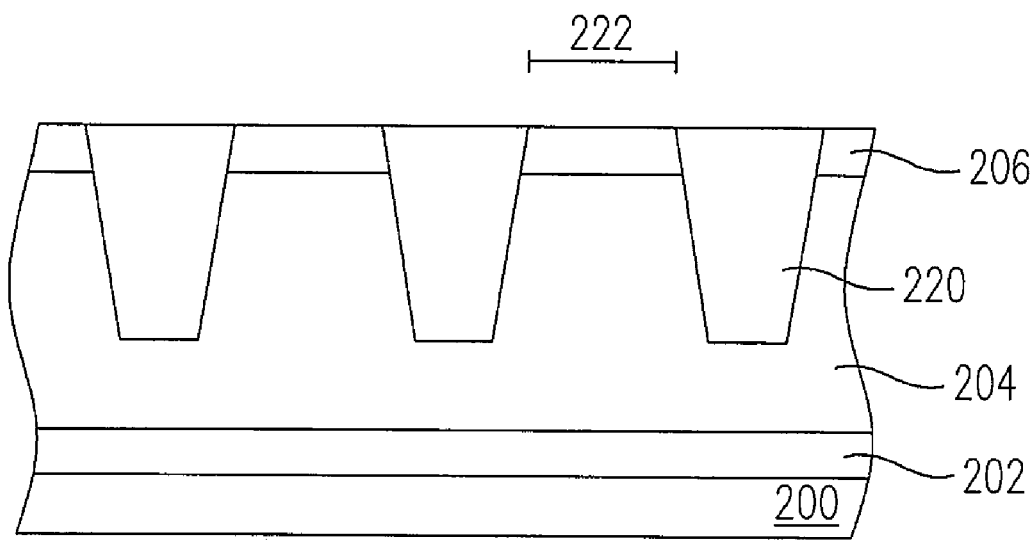
FIG. 6A to FIG. 6D are schematic cross-sectional (Y direction) diagrams of FIG. 2 along the cutting line II-II' showing the steps for the fabricating method of the non-volatile memory.

Referring to FIG. 2, FIG. 5A and FIG. 6A, the method involves providing an n-type substrate 200 which can be, for example, a silicon substrate. Thereafter, a plurality of trench isolation structures 220 is formed in the substrate 200 to define the active region 222. The formation method of the trench isolation structure 220 applies the conventional STI process.

Afterwards, a p-type deep well region 202 is formed in the substrate 200 through the ion implantation process to implant the p-type doping. Then, a n-type well region 204 is formed in the p-type deep well region 202 through the ion implantation process to implant the n-type doping. Thereafter, a p-type shallow doped region 206 is formed in the n-type well region 204 and the p-type shallow doped region is contiguous to the surface of the substrate 200. The p-type shallow doping region 206 is formed by performing ion implantation to implant the p-type dopants.

Figure 5B:
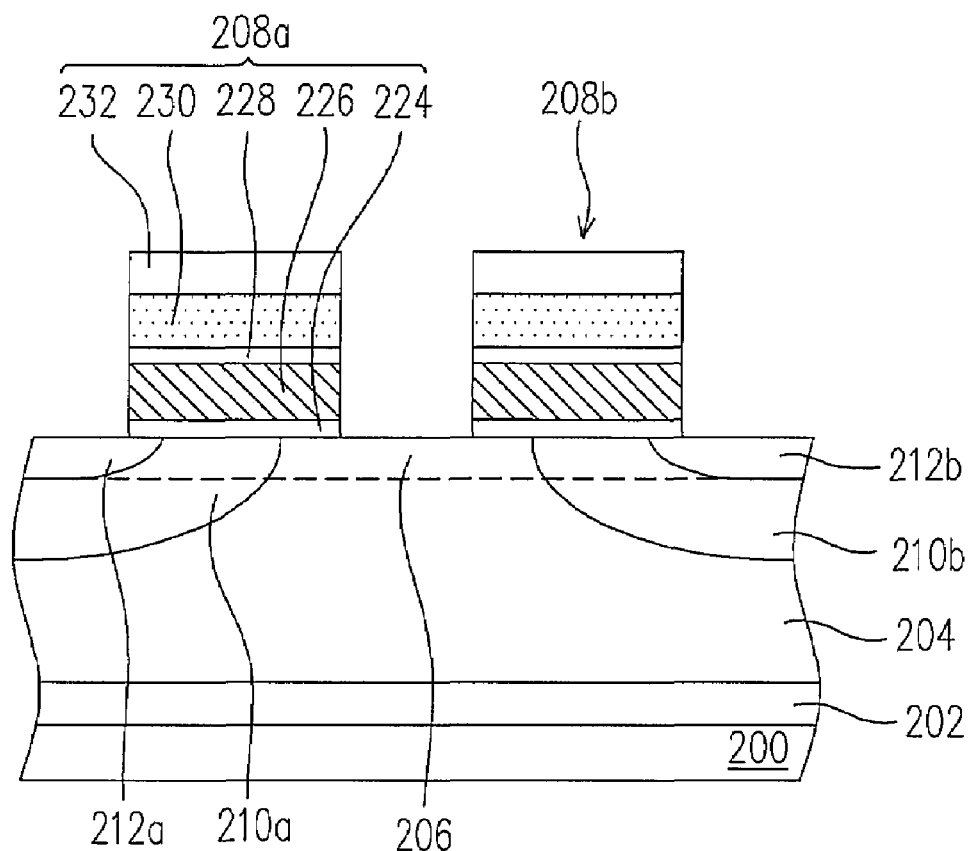
Figure 6B:
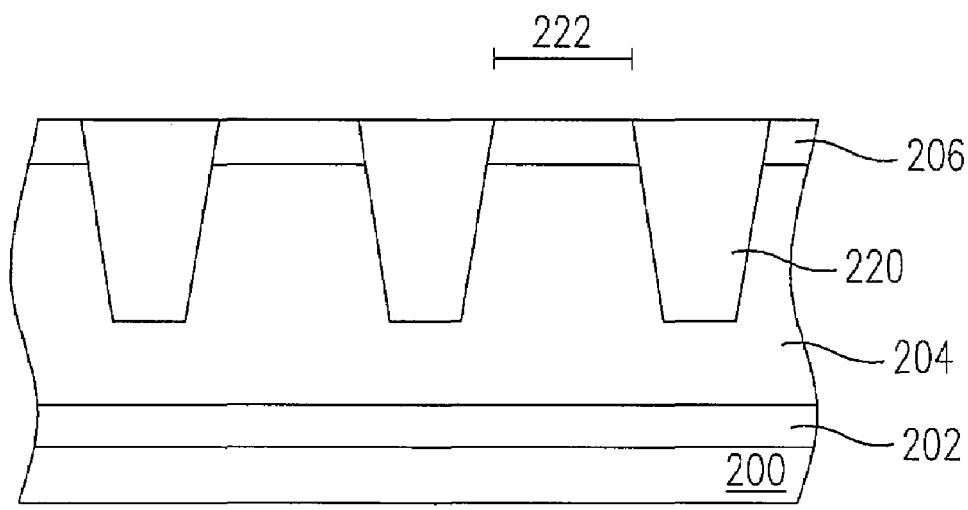

Continuing to FIG. 2, FIG. 5B and FIG. 6B, at least a pair of stacked gate structures 208a and 208b is formed on the substrate 200 of the active region 222, and each stacked gate structure 208a and 208b is disposed at the side of the each trench isolation structure 220. The stacked gate structure 208a and 208b is formed by sequentially stacking the tunnel layer 224, the floating gate layer 226, the gate dielectric layer 228 and the control gate 230 on the substrate 200. The steps for the formation of the stacked gate structures 208a and 208b includes forming a tunneling material layer (not shown in the figures) on the substrate 200, for example, through performing thermal oxidation on the substrate 200. A plurality of floating gate material layers is also formed along the extension direction (X direction) of the trench isolating structure 220. The material for the floating gate material layer includes polysilicon, doped polysilicon and other appropriate materials. Then, a gate dielectric material layer (not shown in the figures) is formed on the floating gate material layer, and the material for the gate dielectric material layer is, for example, silicon nitride or stacked material like silicon oxide/silicon nitride/silicon oxide. Thereafter, a plurality of control gate layers 230 is formed perpendicular to the trench isolation structure 220, extended in Y direction, and the material for the control gate layers 230 is selected from a group of materials that include polysilicon, doped polysilicon and other appropriate material. Besides, the control gate layers 230 are defined by a mask layer 232 having strips that extend along the same direction as the control gate layers. Furthermore, portions of the gate dielectric material layer, the floating gate material layer and the tunneling material layer which are not covered by the control gate layer 230, are removed to form the gate stacked structures 208a and 208b.

Afterwards, the p-type pocket doped regions 210a and 210b are formed in the substrate 200 at the peripheries of the pair of the stacked gate structure 208a and 208b, respectively, and the p-type pocket doped regions 210a and 210b are extended to the underneaths of the stacked gate structure 208a and 208b. The fabricating method of the p-type pocket doped regions 210a and 210b includes forming a mask layer (not shown in the Figures) between the stacked gate structures 208a and 208b to cover the space between the two stacked gate layer 208a and 208b. Thereafter, the mask layer and the two stacked gate layers 208a and 208b are used as an implantation mask to implant the p-type dopants. A drive-in process is performed to complete the implantation process.

Moreover, in the pocket doped regions 210a and 210b, the n-type drain regions 212a and 212b are formed at the peripheries of the paired stacked gate structures 208a and 208b. The fabricating method of the n-type drain regions 212a and 212b includes forming a mask layer (not shown in the figures) between the stacked gate structures 208a and 208b to cover the space between the stacked gate structures 208a and 208b. The mask and the stacked gate structures 208a and 208b are used as implantation mask implant n-type dopants, followed by conducting a drive-in process.

Figure 5C:
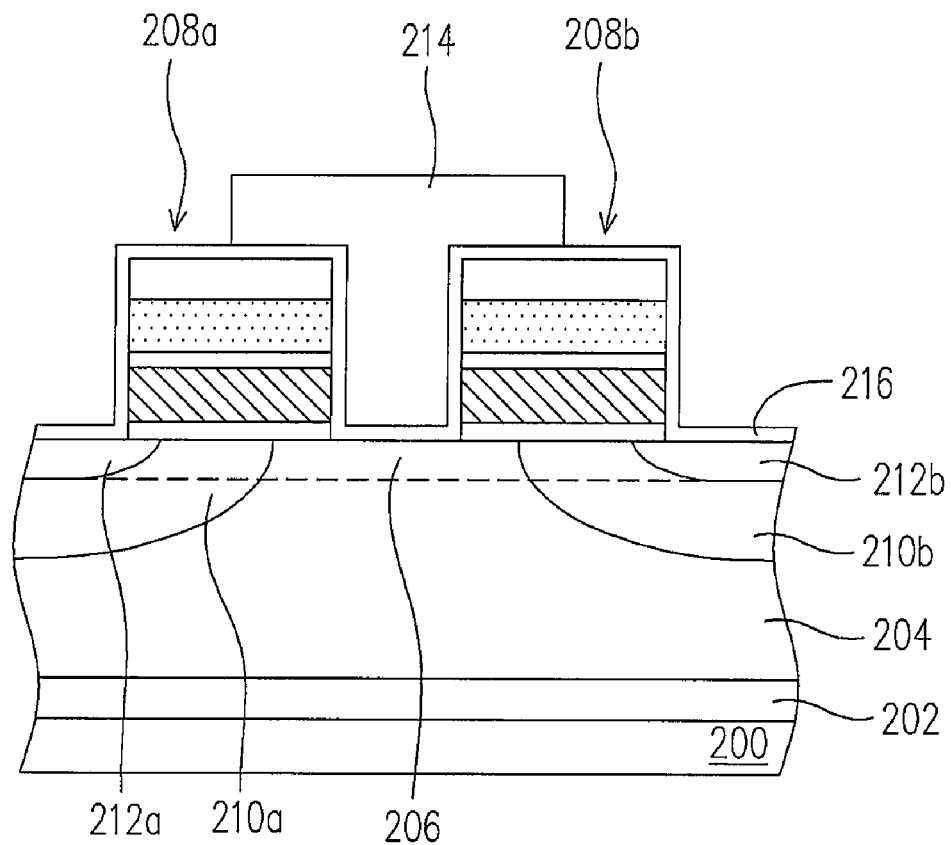
Figure 6C:
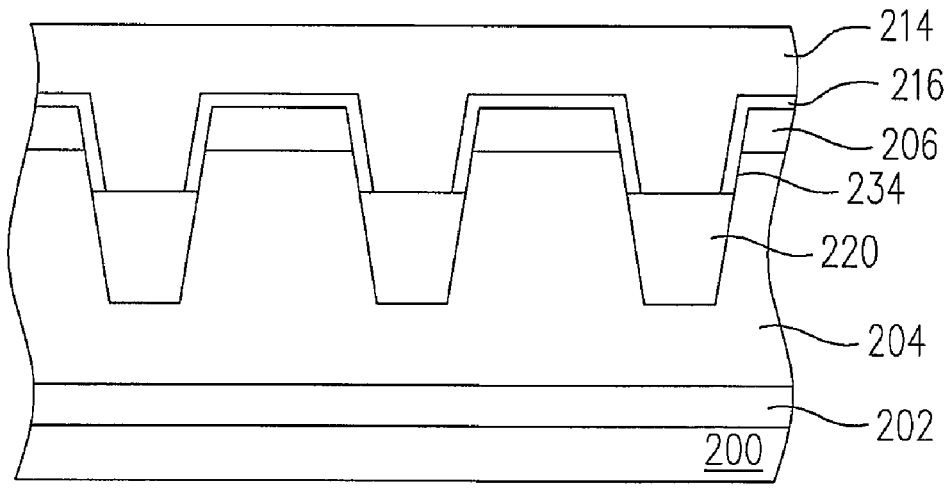

Referring to FIG. 2, FIG. 5C and FIG. 6C, a portion of each trench isolation structure 220 disposed between the stacked gate structures 208a and 208b is removed to enable the surface of the trench isolation structure 220 lower than the bottom of the p-type doped region 206 to form at least two trenches 234 in the substrate 200. In particular, due to the material difference between the trench isolation structure 220 and the substrate 200, self-alignment is applied in removing the portion of each trench isolation structure.

Thereafter, a gate dielectric layer 216 is formed on the surface of the exposed substrate 200 and the stacked gate structures 208a and 208b. The fabricating method for the gate dielectric layer 216 can be, for example, oxidation.

Afterwards, between the two stacked gate structures 208a and 208b, an auxiliary gate layer 214 is formed on the gate dielectric layer 216, and the auxiliary gate layer 214 also fills the trench 234. The material of the auxiliary gate structure 214 is selected from a group consisting of polysilicon, doped polysilicon and other appropriate materials. The fabricating method of the auxiliary gate layer 214 includes forming an auxiliary gate material layer (not shown in the figures), and performing the lithography process and the etching process to define a plurality of auxiliary gate layers that are extended in the Y direction, perpendicular to the trench isolation structure 220.

Figure 5D:
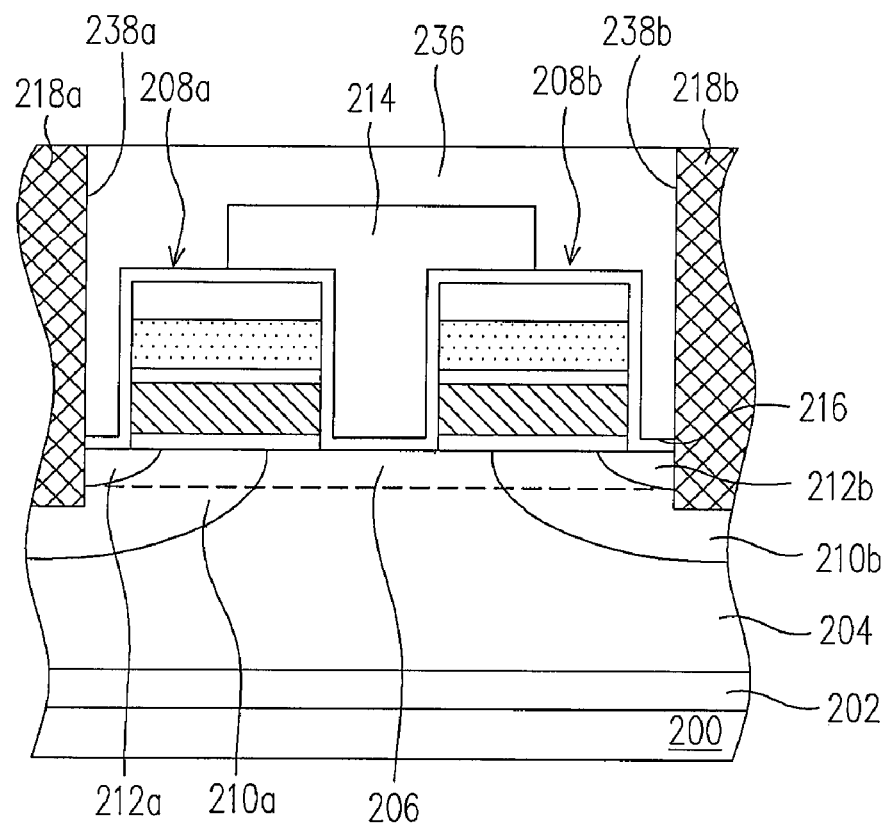
Figure 6D:
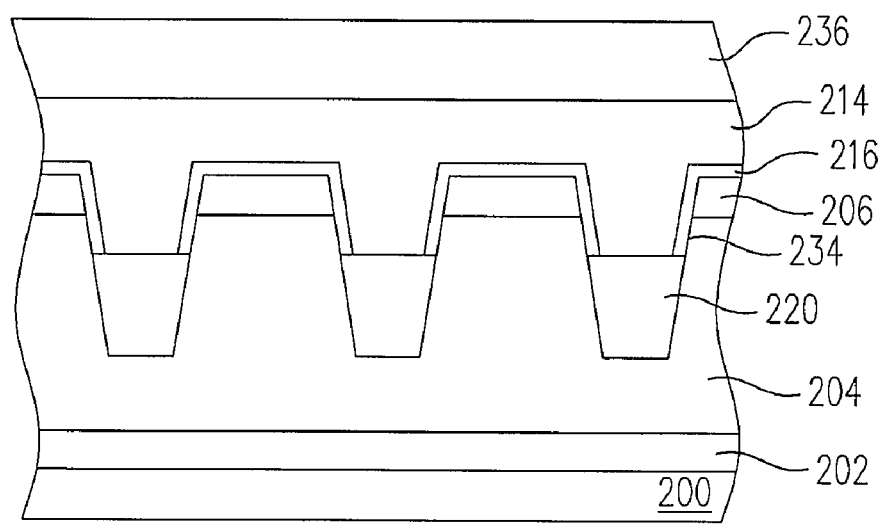

Referring next to FIG. 2, FIG. 5D and FIG. 6D, a dielectric layer 236 is formed on the substrate 200 to cover the auxiliary gate layer 214 and the gate dielectric layer 216, and there are at least two contact window openings 238a and 238b formed in the dielectric layer 236. The contact window opening 238a exposes the drain region 212a and a portion of the pocket doped region 210a. Concurrently, the contact window opening 238b exposes the drain region 212b and a portion of the pocket doped region 210b. The material for the dielectric layer 236 is selected from the group consisting of silicon oxide, silicon oxygen nitride and other appropriate materials. The fabricating method for the dielectric layer 236 includes forming a dielectric material layer on the substrate 200, followed by defining the contact window opening 238a and 238b through the lithography process and the etching process.

Moreover, a plurality of conducting plugs 218a and 128b are formed in the contact window openings 238a and 238b, respectively. The conducting plug 218a is connected to the drain region 212a and the pocket doped region 210a through short circuit, while the conducting plug 218b is connected to the drain region 212b and the pocket doped region 210b through short circuit. The material for the conducting plugs is selected from the group consisting of tungsten and other appropriate conducting material. The fabricating method for the conducting plugs includes filling the contact window openings 238a and 238b with the conducting material, followed by performing chemical mechanical polishing or back etching to remove the conducting material outside the contact window openings 238a and 238b.

In accordance with the fabricating method of the non-volatile memory for the present invention, the auxiliary gate layer is applied to control the induction of the source region during the programming process. By applying the appropriate auxiliary gate voltage to control the induction of the source region, the current leakage of the devices which often occurs in the conventional programming operation, can be prevented due to no induction of the source region. In addition, the fabricating method of the present invention is compatible with the conventional method; therefore, there is no extra spending for equipments is required.

The programming, erasing and reading processes for a NOR type non-volatile memory will be presented.

Figure 7:
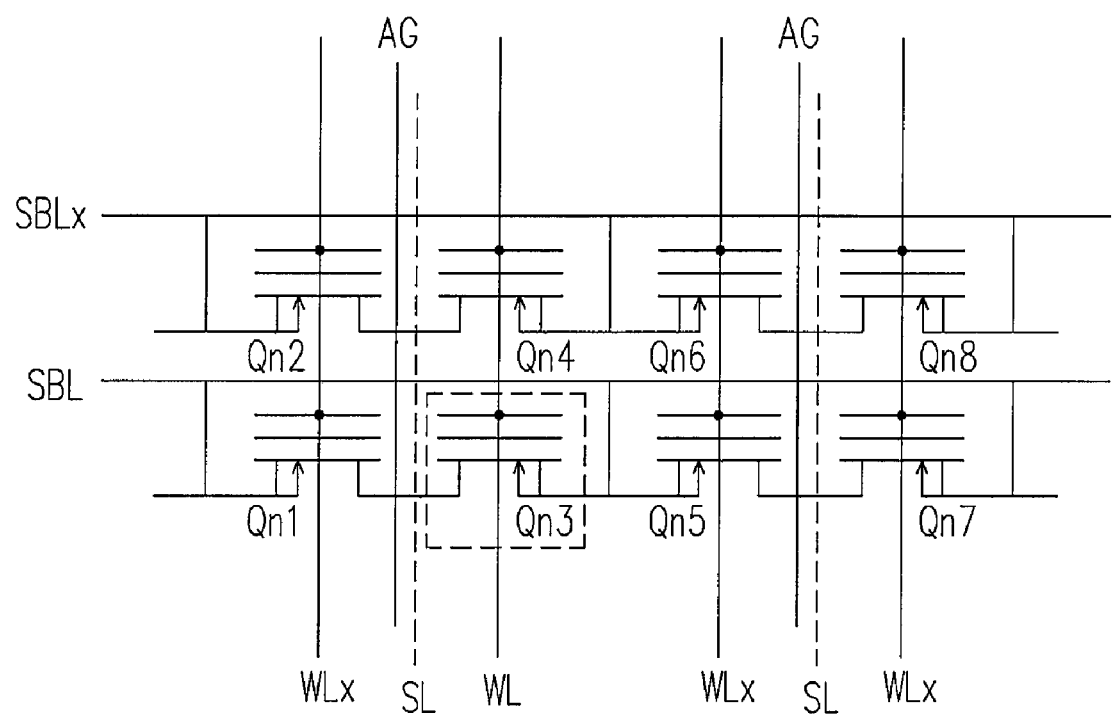
FIG. 7 is a schematic diagram illustrating the equivalent circuit chart of a NOR memory array according to an embodiment of the present invention.

FIG. 7 is a schematic diagram illustrating the equivalent circuit chart of a NOR memory array according to an embodiment of the present invention; Table 1 records the voltages applied during an actual operation. However, the recorded voltage in table 1 is an example and is not intended to limit the invention.

Referring to FIG. 7, a plurality of memory cells Qn1-Qn8 arranged in a 4*2 array is presented. Also shown in FIG. 7, the selected word lines (WL) connected to the vertical column of memory cells and the non-selected word lines (WLx) are presented. According to the embodiment of the present invention, the selected word lines (WL) connects, for example, the control gate layer of the memory cells Qn3 and Qn4 along the same column; while the non-selected word lines (WLx) connects, for example, the control gate layer of the memory cells Qn1 and Qn2 (or memory cells Qn5 and Qn6, or memory cells Qn7 and Qn8) in the same column. The source line (SL) connects the first conducting well regions (ex: n-type well region 204) along the same columns of the memory cells and the source line (SL) is shared by two rows of neighboring memory cells. In accordance with the embodiments of the present invention, the source line (SL) is, for example, the first conducting well region that connects the memory cells Qn3 and Qn4 in the same column, and two neighboring memory cells Qn1 and Qn3 which are along the same row share the first conducting well region. The auxiliary gate line AG of the auxiliary gate layer connects the memory cells in the same column, and two horizontal rows of neighboring memory cells share the same auxiliary gate line AG. In accordance with the embodiments of the present invention, the auxiliary gate line AG is, for example, the auxiliary gate layers that connect the memory cells Qn3 and Qn4 along the same column, and the two neighboring memory cells Qn1 and Qn3 along the same row share the same auxiliary gate line AG. Regarding the selected bit line (SBL) memory cell and the non-selected bit line (SBLx), according to the embodiment of the present invention, the selected bit line (SBL) is, for example, the drain regions that connect the memory cells Qn1, Qn3, Qn5 and Qn7 along the same row, while the non-selected bit line (SBLx) is, for example, the drain regions that connect the memory cells Qn2, Qn4, Qn6 and Qn8 along the same row.

TABLE 1

|  | programming | erasing | reading |
|---|---|---|---|
| selected word lines (WL) | −10 volts | 10 volts | 3.3 volts |
| non-selected word lines (WLx) | −2 volts | 10 volts | 0 volts |
| selected bit line (SBL) | 6 volts | Floating (F) | 0 volts |
| non-selected bit line (SBLx) | 0 volts | Floating (F) | Floating (F) |
| Source line (SL) (n-type well region 204) | 6 volts | −6 volts | 1.65 volts |
| auxiliary gate line AG | 0 volts | Floating (F) | 3.3 volts |
| p-type deep well region (202) | 0 volts | −6 volts | 0 volts |

Figure 4:
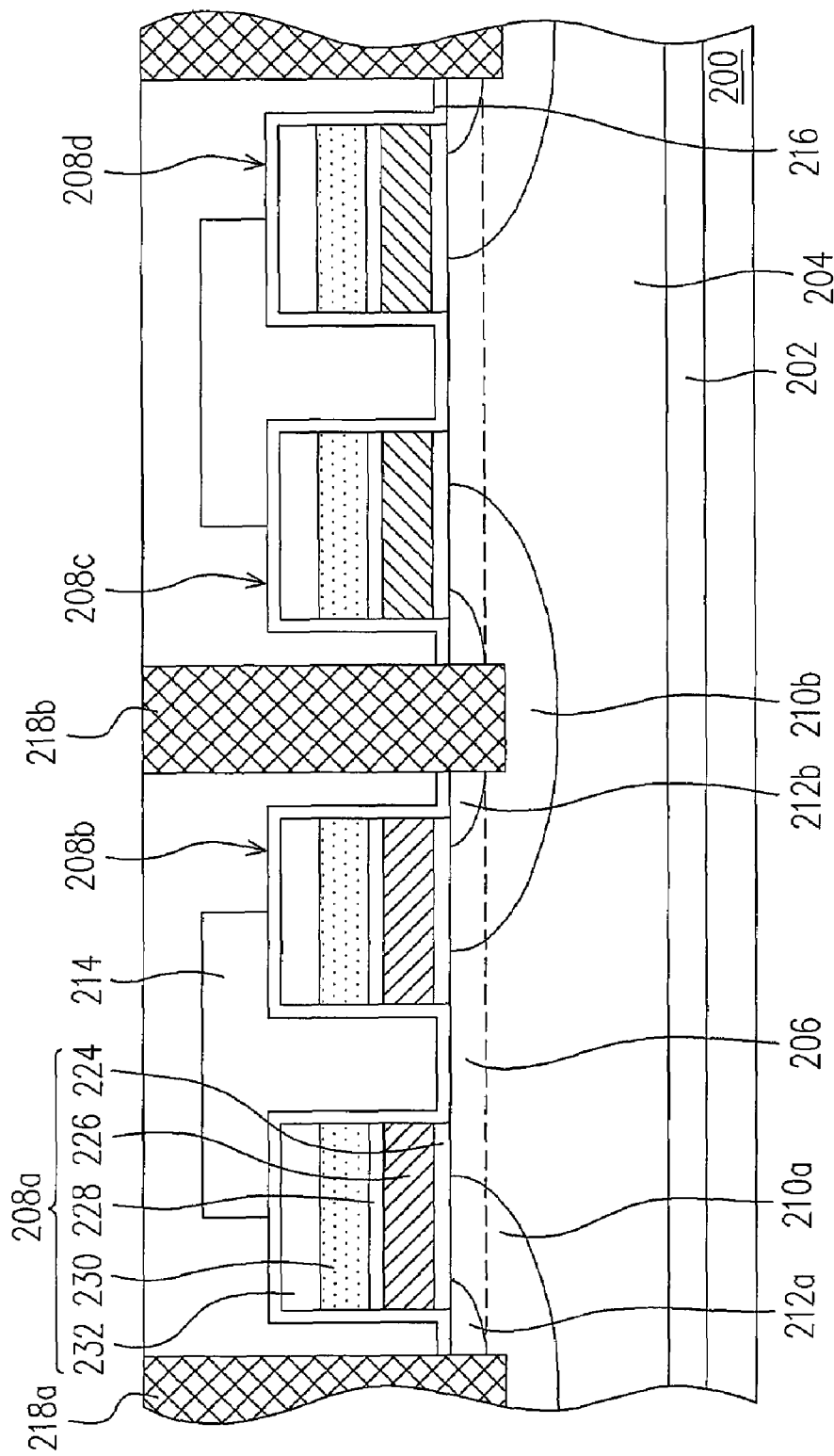
FIG. 4 is a schematic cross-sectional diagram of a non-volatile memory according to an embodiment of the present invention.

Please referring to FIG. 4, FIG. 7 and Table 1, in order to eject the charges from the floating gate layer 226 through F-N tunneling mode during the programming operation of the non-volatile memory in the present invention, a first voltage is applied to the control gate 230 of the selected memory cell (ex: 208b in the FIG. 4 and Qn3 in the FIG. 7), a second voltage is applied to the drain region 212b at the side of the selected memory cell and the n-type well region 204, a third voltage is applied to the auxiliary gate layer 214 and the p-type deep well region 202. In addition, during the programming process, a fourth voltage is applied to the control gate layers of the neighboring memory cells, and a fifth voltage is applied to the bit lines (drain region) of the neighboring memory cells. In an embodiment of the present invention, the above mentioned first voltage ranges between −5 and −15 volts, for example; the second voltage ranges between 1 and 10 volt, for example; the third voltage is, for example, 0 volt; the fourth voltage ranges between −1 and −10 volts, for example; the fifth voltage is, for example, 0 volts. In the embodiment of the present invention, the first voltage is, for example, −10 volts; the second voltage is, for example, 6 volts; the third voltage is, for example, 0 volt; the fourth voltage is, for example, −2 volts; the fifth voltage is, for example, 0 volt.

In particular, according to the present invention, the auxiliary gate layer is applied to induce the source region during the programming process. Depending on the applied auxiliary gate voltage, there can be no induction of the source region. Therefore, the selected memory cell will not affect the neighbouring memory cells, and the reliability device is improved. In addition, the current leakage problem for the devices is prevented.

Besides, during the erasing operation, a sixth voltage is applied to the control gate layer 230 of the selected memory cell (ex: 208b in the FIG. 4 and Qn3 in the FIG. 7) of the above mentioned non-volatile memory in the present invention, a seventh voltage is applied to the n-type well region 204 and p-type deep well region 202, and the drain region 212b at the side of the selected memory cell and the auxiliary gate layer 214 are set at floating for charges to be injected into the floating gate layer 226 through the F-N tunneling mode. Besides, during the erasing operation, the control gate layers of the neighboring memory cells is applied with the same voltage as the control gate layer of the selected memory cell. Furthermore, the bit line (drain region) of the neighboring memory cells is set at floating. In an embodiment of the present invention, the above mentioned sixth voltage ranges between 5 and 15 volts, for example; the seventh voltage ranges between −5 and −15 volts, for example. In the embodiment of the present invention, the sixth voltage is, for example, 10 volts; and the seventh voltage is, for example, −6 volts.

Moreover, during the reading operation, an eighth voltage is applied to the control gate layer 230 of the selected memory cell (ex: 208b in the FIG. 4 and Qn3 in the FIG. 7) and the auxiliary gate layer of the above mentioned non-volatile memory in the present invention, a ninth voltage is applied to the n-type well region 204, a tenth voltage is applied to the drain region 212b at the side of the selected memory cell and the p-type deep well region 202, an eleventh voltage is applied to the control gate of the neighboring memory cells during the reading operation. In addition, the control gate of the neighboring memory cells (drain regions) is set at floating. In an embodiment of the present invention, the above mentioned eighth voltage ranges between 1 and 10 volts, for example; the ninth voltage ranges between 1 and 10 volts, for example; the tenth voltage is, for example, 0 volt; the eleventh voltage is, for example, 0 volt. In the embodiment of the present invention, the eighth voltage is, for example, 3.3 volts; the ninth voltage is, for example, 1.65 volts; the tenth voltage is, for example, 0 volt; and the eleventh voltage is, for example, 0 volt.

Although there is no source region disposed in the memory cell of the present invention, the source region can be induced by applying a voltage to the auxiliary gate layer to form a source inversion layer, which is also known as the virtual source line. Therefore, the reading operation can be performed through the formation of the virtual source line.

In accordance with the present invention, the auxiliary gate layer is applied to control the induction of the source region during the programming process. By applying the appropriate auxiliary gate voltage, the source region is not induced, and the current leakage for the devices is prevented. Further, the selected memory cell will not affect the neighbouring memory cells. Besides, in order to perform the reading process, the virtual source line can be generated by applying a voltage to the auxiliary gate layer to perform the reading operation.

It will be apparent that the above mentioned description with attached figures are exemplary and explanatory for the objects, specification and merits of the present invention only, and are not restrictive of the invention, those skilled in the art that various modifications and variations can be made to the present invention without departing from the scope or spirit of the invention. In view of the foregoing, it is intended that the present invention cover modifications and variations of this invention provided they fall within the scope of the following claims and their equivalents.

What is claimed is:

1. A fabricating method for a non-volatile memory, comprising:

providing a substrate;

defining an active region by forming a plurality of trench isolation structures in the substrate;

forming a first conducting type well region;

forming a second conducting type shallow doped region in the first conducting type well region, wherein the second conducting type shallow doped region is contiguous to a surface of the substrate;

forming at least a pair of stacked gate structures on the substrate of the active region, wherein each stacked gate structure is disposed at a side of the each trench isolation structure, and the stacked gate structure is formed with at least a floating gate layer and a control gate layer on the floating gate layer;

forming two second conducting type pocket doped regions in the substrate and at peripheries of the stacked gate structures, wherein each pocket doped region is extended to an underneath of each stacked gate structure;

forming two first conducting type drain regions in the two pocket doped regions at the peripheries of the pair of stacked gate structures;

removing a portion of the trench isolation structures between the stacked gate structures for a surface of the trench isolation structures to be lower than a bottom of the second conducting type shallow doped region and formed at least two trenches in the substrate;

forming a gate dielectric layer on surfaces of the stacked gate structures and an exposed substrate;

forming an auxiliary gate layer on the gate dielectric layer between the two stacked gate structures;

forming a dielectric layer on the substrate to cover the gate dielectric layer and the auxiliary gate layer, wherein at least two contact window openings are formed in the dielectric layer, and each drain region and a portion of each pocket doped region are exposed by the contact window openings; and forming a plurality conducting plugs in the contact window openings.

2. The fabricating method for the non-volatile memory as recited in claim 1, wherein the step of removing the portion of each trench isolation structure comprises a self-aligned etching process.

3. The fabricating method for the non-volatile memory as recited in claim 1, wherein the substrate is a first conducting type substrate.

4. The fabricating method for the non-volatile memory as recited in the claim 1, wherein after the step of forming the trench isolation structures in the substrate and before the step of the first conducting type well region, the fabricating method further comprises forming a second conducting type deep well region, and the first conducting type well region is disposed in the second conducting type deep well region.

5. The fabricating method for the non-volatile memory as recited in claim 1, wherein the stacked gate structures is formed with a tunnel layer, a floating gate layer, a gate dielectric layer and a control gate layer sequentially on the substrate.

6. The fabricating method for the non-volatile memory as recited in the claim 1, wherein materials for the auxiliary gate layer, the floating gate layer or the control gate layer are selected from the group consisting of polysilicon and doped polysilicon.

7. The fabricating method for the non-volatile memory as recited in the claim 1, wherein the connection between the conducting plugs and each drain region and each pocket doped region is via a short circuit.

8. The fabricating method for the non-volatile memory as recited in claim 1, wherein the first conducting type is an n-type and the second conducting type is a p-type.

9. The fabricating method for the non-volatile memory as recited in claim 1, wherein the auxiliary gate layer fills the two trenches.

* * * * *